(12) United States Patent
Koch

(10) Patent No.: US 10,123,626 B2
(45) Date of Patent: Nov. 13, 2018

(54) MANUAL OPERATING UNIT, MANUAL OPERATING SYSTEM, FURNITURE CONTROL SYSTEM, BED AND ARMCHAIR

(71) Applicant: LOGICDATA Electronic & Software Entwicklungs GmbH, Deutschlandsberg (AT)

(72) Inventor: Walter Koch, Schwanberg (AT)

(73) Assignee: LOGICDATA Electronic & Software Entwicklungs GmbH, Deutschlandsberg (AT)

( * ) Notice: Subject to any disclaimer, the term of this patent is extended or adjusted under 35 U.S.C. 154(b) by 198 days.

(21) Appl. No.: 15/037,665

(22) PCT Filed: Oct. 29, 2014

(86) PCT No.: PCT/EP2014/073249
§ 371 (c)(1),
(2) Date: May 18, 2016

(87) PCT Pub. No.: WO2015/071103
PCT Pub. Date: May 21, 2015

(65) Prior Publication Data
US 2016/0286965 A1 Oct. 6, 2016

(30) Foreign Application Priority Data
Nov. 18, 2013 (DE) .................... 10 2013 112 677

(51) Int. Cl.
*H01H 13/70* (2006.01)
*A47C 7/62* (2006.01)
(Continued)

(52) U.S. Cl.
CPC ............... *A47C 7/62* (2013.01); *A47C 7/748* (2013.01); *A47C 17/04* (2013.01); *A47C 21/048* (2013.01);
(Continued)

(58) Field of Classification Search
CPC ...................................... A47C 17/04
(Continued)

(56) References Cited

U.S. PATENT DOCUMENTS 6,037,723 A * 3/2000 Shafer .................. A47C 27/082
318/6
6,492,997 B1 12/2002 Gerba et al.
(Continued)

FOREIGN PATENT DOCUMENTS

DE 102005016147 A1 10/2006
DE 202006019659 U1 3/2007
(Continued)

*Primary Examiner* — Fredrick C Conley
(74) *Attorney, Agent, or Firm* — Morgan, Lewis & Bockius LLP

(57) ABSTRACT

A manual operating unit for a furniture control, which is provided in particular for seating or lounging furniture, has a housing with a top side and a bottom side. A first and a third operating panel are defined on the top side and a second and a fourth operating panel are defined on the bottom side, which are located opposite to the first and third operating panels. Actuating the first and second operating panels triggers a first operating signal in each case, whereas actuating the third and fourth operating panels triggers a second operating signal in each case. The housing is movably mounted over push-buttons arranged in the housing at least in the region of the first and third operating panels in such a way that a first of said push-buttons is actuated by moving the housing in the region of the first operating panel and a second of said push-buttons is actuated by moving the housing in the region of the third operating panel.

20 Claims, 4 Drawing Sheets

Figure 1A:
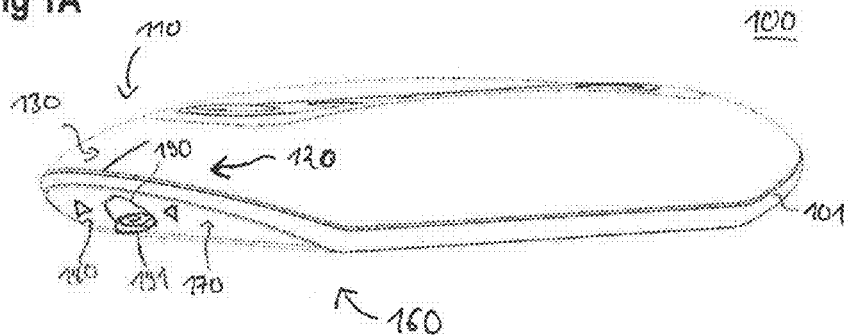

(51) Int. Cl.
*A47C 31/00* (2006.01)
*A47C 7/74* (2006.01)
*A47C 17/04* (2006.01)
*A47C 21/04* (2006.01)
*H02J 7/00* (2006.01)
*H03K 17/945* (2006.01)
*H03K 17/96* (2006.01)
*H01H 9/02* (2006.01)

(52) U.S. Cl.
CPC .......... *A47C 31/008* (2013.01); *H01H 13/70* (2013.01); *H02J 7/0042* (2013.01); *H03K 17/945* (2013.01); *H03K 17/96* (2013.01); *H01H 2009/0257* (2013.01); *H01H 2221/09* (2013.01); *H01H 2231/032* (2013.01)

(58) Field of Classification Search
USPC ........................................ 5/613–618; 345/156
See application file for complete search history.

(56) References Cited

U.S. PATENT DOCUMENTS

| | | |
|---|---|---|
| 6,853,308 B1 | 2/2005 | Dustin |
| 2002/0185985 A1* | 12/2002 | Fraser ................. B60N 2/0244 318/445 |
| 2008/0174546 A1* | 7/2008 | Schneider ............. G06F 3/0202 345/156 |
| 2009/0121660 A1* | 5/2009 | Rawls-Meehan .... A47C 20/041 318/16 |
| 2010/0201171 A1* | 8/2010 | Velderman ............... A47D 9/02 297/260.2 |
| 2013/0289770 A1 | 10/2013 | Rawls-Meehan |

FOREIGN PATENT DOCUMENTS

| | | |
|---|---|---|
| EP | 1178507 A2 | 2/2002 |
| JP | S6123741 U | 2/1986 |
| JP | 2001000494 A | 1/2001 |

* cited by examiner

MANUAL OPERATING UNIT, MANUAL OPERATING SYSTEM, FURNITURE CONTROL SYSTEM, BED AND ARMCHAIR

The present disclosure relates to a manual operating unit for a furniture control, provided in particular for seating or lounging furniture, for a manual operating system with such a manual operating unit and a furniture control system with such a manual operating system. The present disclosure further relates to electrically adjustable furniture items, in particular a bed and an armchair with such a furniture control system.

Manual operating units are provided in a multiplicity of electrically adjustable furniture items, which have individual operating buttons for triggering various adjustment functions. Such conventional manual operating units are frequently inflexible to use or allow only a limited functional scope.

The present disclosure provides an improved operating concept on the basis of a manual operating unit, which allows flexible actuation of adjustable furniture items.

The improved operating concept is based on the idea of a manual operating unit being able to be operated on both sides of the housing thereof, in order to partially trigger different functions of a furniture control. At the same time, however, certain functions can be operated in equal measure by corresponding operating panels on both the top side and the bottom side of a housing of the manual operating unit.

To this end, a first operating panel is defined on the top side, whereas a second operating panel is defined on the bottom side, the latter being arranged opposite to the first operating panel. Actuating the first operating panel as well as the second operating panel triggers a first operating signal.

Preferably, the first and a third operating panel are defined on the top side, whereas the second and a fourth operating panel are defined on the bottom side, the latter being correspondingly arranged opposite to the first and third operating panels, in particular directly opposite thereto. Actuating the first operating panel as well as actuating the second operating panel triggers a first operating signal in each case. Likewise, both actuating the third operating panel and actuating the fourth operating panel triggers a second operating signal. The operating signals are preferably adjusting signals in two possible adjusting directions, which can be transmitted to the furniture control in this form.

In addition to the stated operating panels, further operating possibilities are preferably provided on the top and bottom sides of the housing of the manual operating unit.

The housing in one embodiment is movably mounted over push-buttons arranged in the housing at least in the region of the first or the first and third operating panel(s) in such a way that a first of said push-buttons is actuated by moving the housing in the region of the first operating panel and, if present, a second of said push-buttons is actuated by moving the housing in the region of the third operating panel. A user will thus exert the appropriate pressure on the housing in the predefined regions for actuating the operating panels, in order to actuate the underlying push-button. This also enables the user to receive haptic feedback.

The bottom side of the housing of the manual operating unit in further embodiments has a flat or substantially flat first region, thus allowing the manual operating unit in the first region to lie flat and stable on a more or less flat surface, such as a mattress, an armrest or a bedside table, for example. Slight curvatures or lateral bevels in the first region are possible. The bottom side also has at least one inclined second region with regard to the first region, wherein the second and, if present, the fourth operating panel is defined in the second, inclined region. The inclination is designed in such a way that, in the event of an overlying first region, an interval of the second region to the contact surface exists in each case. The second region can be bevelled or have a curvature, which has a constant or inconstant slope or a constant or inconstant radius of curvature.

Such an arrangement ensures that the second and fourth operating panels are not unintentionally actuated when the manual operating unit lies on the bottom side, in particular on the first region.

In some embodiments a function select button is arranged in the second, inclined region, which in particular is provided for selecting an operating option of the manual operating unit. Such operating options comprise, for example, the adjustment of a head part of a bed, a foot part of a bed or a simultaneous adjustment of head and foot parts. Switching between these operating options is possible via the function select button.

The first region preferably forms a main contact surface on the bottom side, wherein the function select button is arranged spaced apart from the plane formed by the main contact surface. Thus, at least in the event of a substantially smooth surface, on which the first region lies, no undesired actuation of the function select button occurs. However, it is also possible to bring the second region onto the contact surface and thus indirectly actuate the function select button by inclining the manual operating unit. This arrangement thus allows an actuation both when the top side of the manual operating unit is facing away from a surface or facing a user and when the bottom side is facing the user. Thus, flexibility of operation is further increased.

According to the improved operating concept, the function select button allows a function selection to be made, while the operating panels allow an adjustment to be made within such functional options on the top side or the bottom side.

In various embodiments a display device is arranged in the second, inclined region, which is provided for displaying a selected operating option of the manual operating unit. Display surfaces can be provided to this end, for example, which are rendered visible by corresponding background lighting.

In various embodiments a display is provided in the first region, which is substantially flat, said display being in particular a graphic display or an LCD, liquid crystal display. The display preferably has a touch-sensitive operating surface. In other words, the display can also be designed as a so-called touchscreen. Thus, the bottom side of the manual operating unit has a further operating option, but at least a signalization option for a user. Said operating option allows specific functions of the furniture item to be selected or activated, for example. It is thus up to the users themselves to decide whether to execute simple operations on the top side or on the bottom side of the manual operating unit. The user can flexibly reach the extended operations by using the bottom side.

The top side of the housing is also provided with one or more select buttons in various embodiments. The manual operating unit is preferably set up to transmit a saved sequence of control commands to a furniture control coupled with the manual operating unit when one of the select buttons is actuated. Such a sequence in a control for a bed can initially, for example, be the adjustment of a specific bed position with a subsequent start of a massage function and a corresponding lighting setting. Arbitrary control combinations can of course be implemented, and therefore the above-cited example is not intended to be limiting.

The select buttons can, for example, also be used as rapid select buttons or rapid access buttons.

The manual operating unit preferably comprises a wireless communication module, which is set up for exchanging data with a furniture control, in particular for transmitting control commands to the furniture control, thus in particular allowing the first and second operating signals as well as further operating signals or combinations of such operating signals to be transmitted to the furniture control. If necessary, status information can also be received by the furniture control and, if present, emitted via the graphic display on the bottom side.

In some embodiments the manual operating unit has an automatic configuration option, which is intended to make the availability of diverse functions on the manual operating unit dependent on the configuration of the control. For example, the manual operating unit can exchange the necessary or available functions with the furniture control via the respective communication module or receive such from the furniture control. This thus enables the manual operating unit to retrieve the configuration from the furniture control, or enables the furniture control to independently send the configuration to the manual operating unit. According to such configuration, the manual operating unit is then intended to execute or offer only the respectively configured/available functions.

Such a control-dependent configuration is in particular advantageous in the embodiments of the manual operating unit with graphic display and/or operating option on the bottom side, but can also affect the configuration of the select buttons.

For example, the furniture control is configured on a bed with four adjustable motors and two massage zones. In such case, the manual operating unit should have precisely such operating functions. In another configuration the furniture control is configured on a bed with two adjustable motors and three heating zones. In such case too, the manual operating unit is then intended to execute and/or offer precisely such operating functions and not offer any non-existing functions at all.

The select buttons can have background lighting, which is activated either when the select buttons are activated or in the event of proximity, for example a hand on the manual operating unit.

The manual operating unit in various embodiments has rechargeable batteries, but can also be operated with normal batteries. The manual operating unit preferably has corresponding connection elements for charging the rechargeable batteries. Such charging can, for example, ensue in a corresponding docking station.

For example, one embodiment of a manual operating system has a manual operating unit according to one of the previously described embodiments, as well as a docking station for accommodating the manual operating unit. The manual operating unit accommodated in the docking station is thereby supplied with power from the docking station via corresponding electrical contacting, in particular for charging an energy storage, such as a rechargeable battery of the manual operating unit.

The docking station preferably has electrical contacts, which can be accommodated in a recess on the bottom side of the manual operating unit. Such a recess is preferably designed in a third inclined region, which is inclined with regard to the first region, as in the previously described second region. For example, the second and third inclined regions are arranged on both sides of the first, flat region, in particularly symmetrically arranged.

The docking station is preferably connected to a charging device or to the furniture control via a cable, in order to obtain a corresponding power supply for the charging contacts. A data connection between the docking station and the furniture control is not essential, but is of course possible. Further contacts, in addition to the charging contacts, can also be provided in the manual operating unit and in the docking station, said further contacts allowing an electrical, in particular serial data connection between the manual operating unit and the docking station.

In some embodiments the docking station can also be a USB port for charging corresponding devices, such as mobile phones, tablets or such like.

In some implementations an ambient light can be provided in the docking station, said ambient light being activated by corresponding activation in the manual operating unit. For example, a proximity-sensitive sensor and/or a touch-sensitive sensor and/or a button is provided to this end in the manual operating unit, preferably on the top side of the housing, said sensors or buttons allows the switching on of a corresponding lighting element in the docking station to be triggered. Instead of or in addition to the ambient light in the docking station, lighting elements can also be provided in or on the manual operating unit, said lighting elements being able to be used as ambient lighting. If present, for example, background lighting of the described select buttons or the optional display on the bottom side can be used to this end.

For example, the system is also set up in such a way that an idle operating status or standby mode is provided, which is ended when the lighting element or the corresponding sensitization is activated.

The various embodiments of the manual operating system with docking station and manual operating unit allow a basic operation of the manual operating unit, even if the manual operating unit is inserted in the docking station. The bottom side of the housing is thereby in particular facing the docking station, whereas the top side of the housing is freely accessible. Thus, the basic functions can be achieved via the first and, if present, the third operating panel as well as, if present, corresponding select buttons. The idle status can only affect the manual operating unit or the associated furniture control.

A manual operating system according to one of the previously described embodiments can, for example, be used in furniture control system, which comprises an additional furniture control, which is coupled with the manual operating unit for receiving control commands, and is set up in such a way as to actuate at least one adjusting motor of an electrically adjustable furniture item. In addition to or instead of an adjusting motor, other elements, such as a heating system, a massage motor for a massage function or such like, can also be activated by the furniture control.

Such a furniture control system can, for example, be used in an electrically adjustable bed or in an electrically adjustable armchair, but also in other electrically adjustable furniture items.

In the following, the improved operating concept is explained in more detail in a plurality of embodiments on the basis of illustrations. Identical reference signs identify elements or components with identical functions. Should circuit parts or component parts correspond in their functions, the description thereof will not be repeated in each of the following illustrations.

Figure 1B:
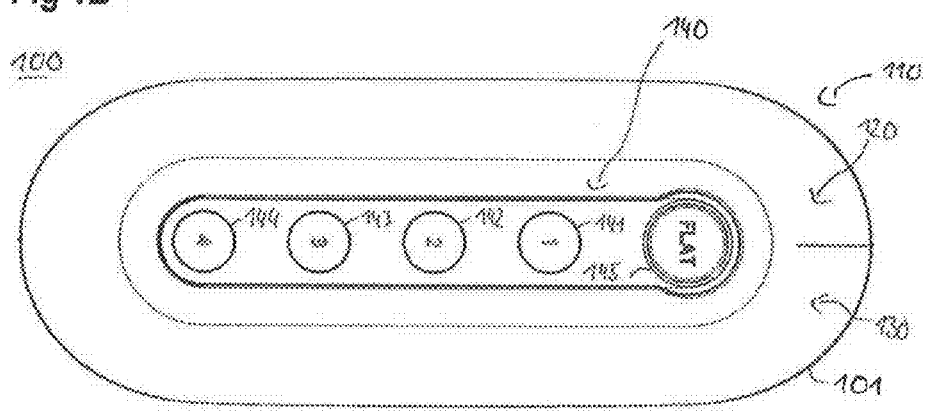
Figure 1C:
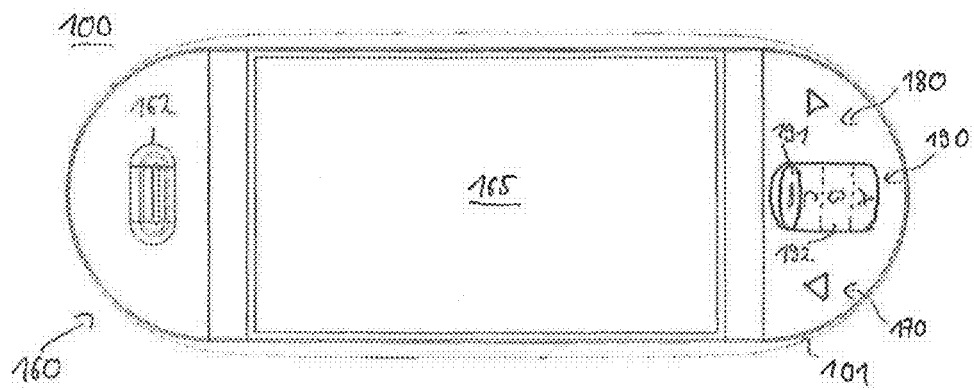
Figure 2:
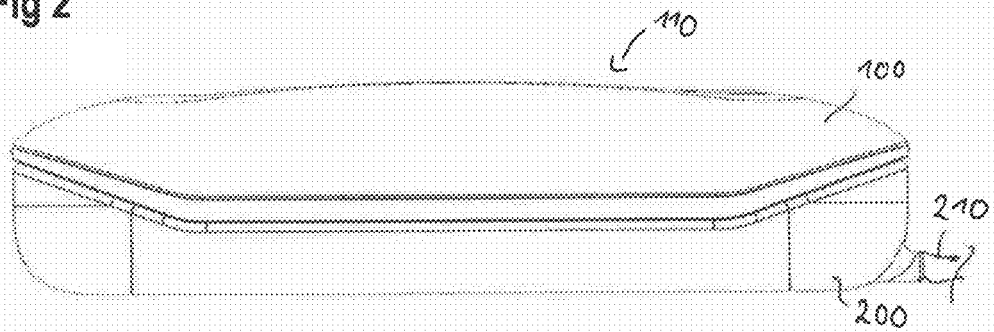
Figure 3A:
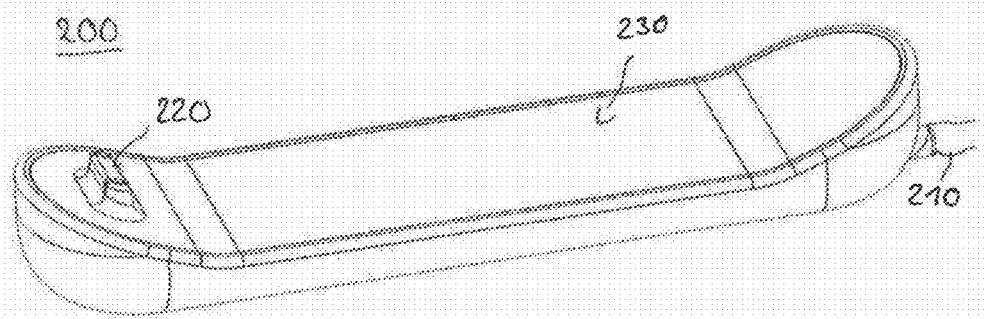
Figure 3B:
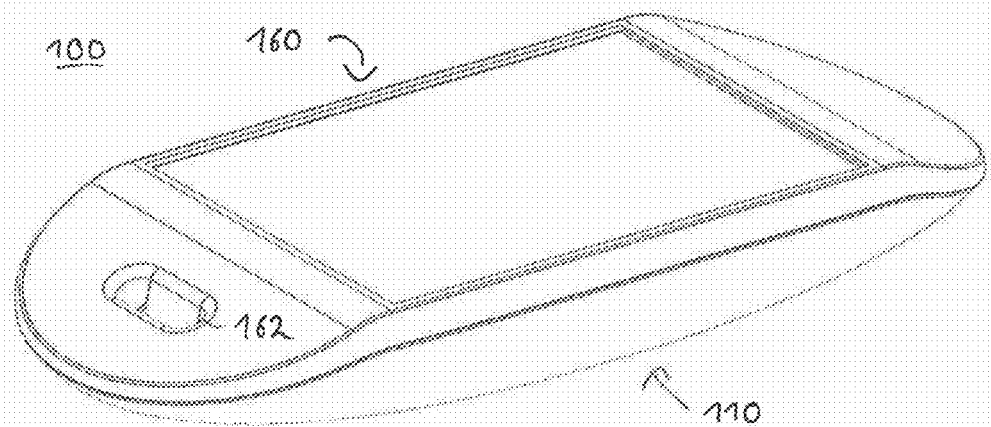
Figure 4A:
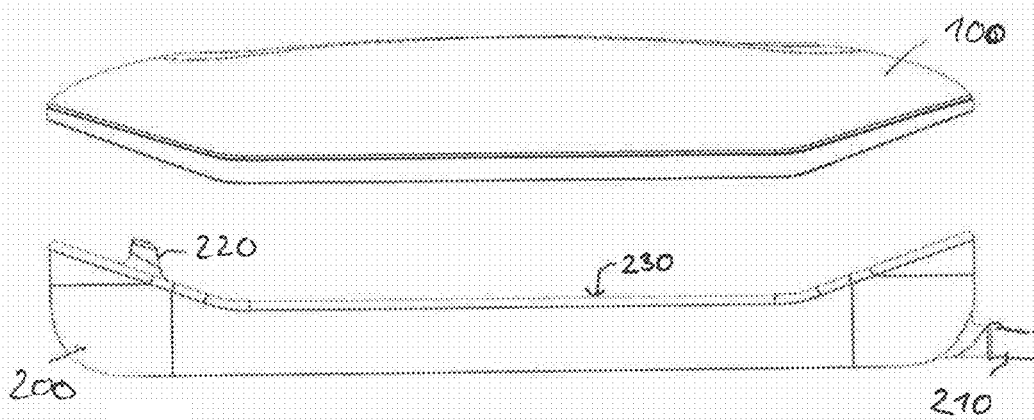
Figure 4B:
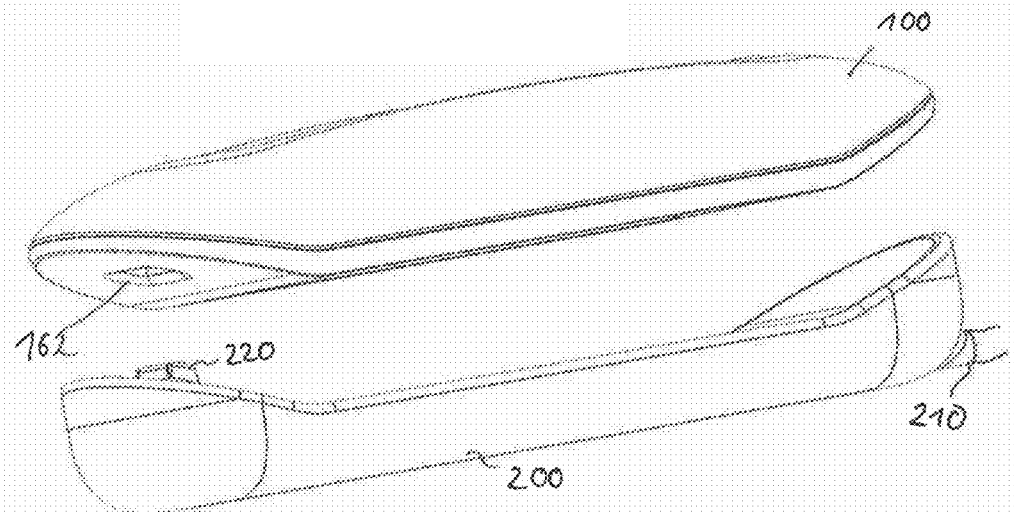
Figure 4C:
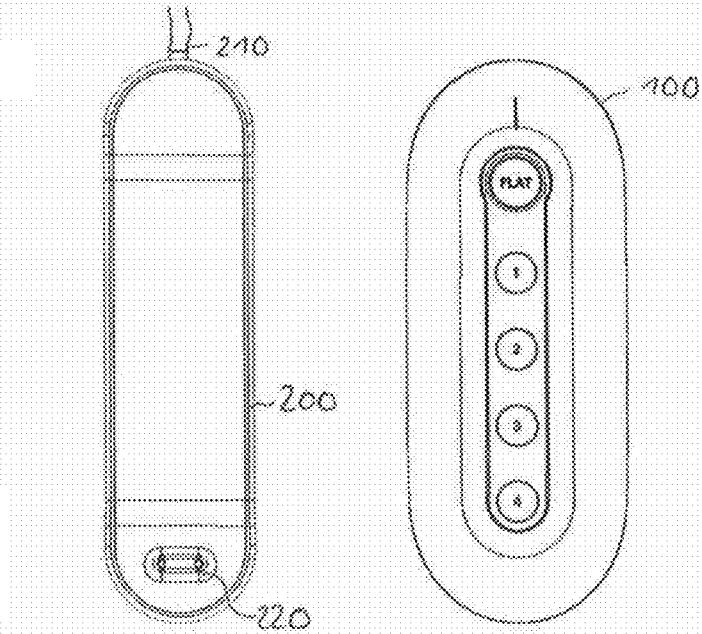
Figure 5:
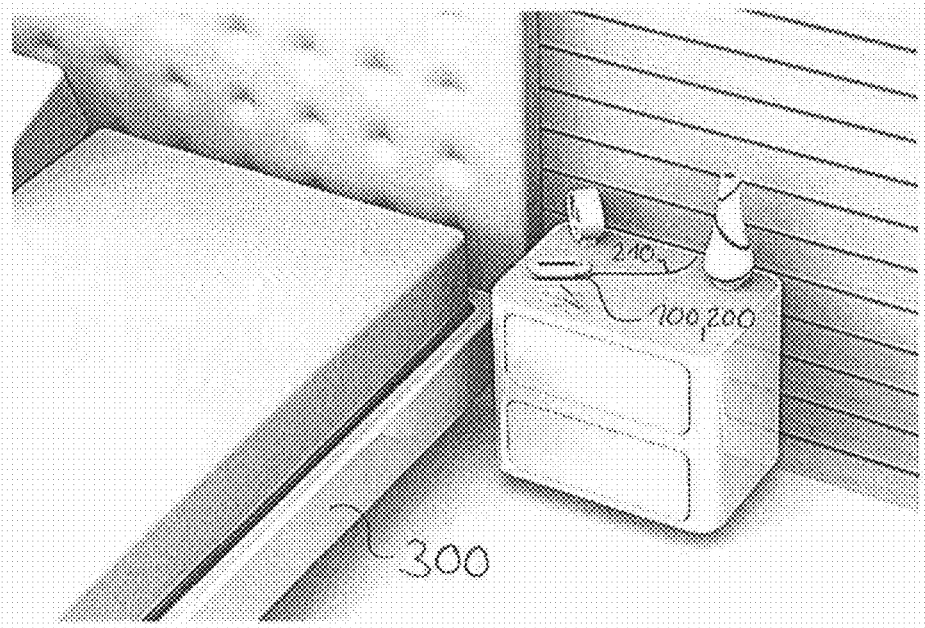

Shown in:

FIGS. 1A, 1B and 1C are various views of an exemplary embodiment of a manual operating unit, FIG. 2 is an embodiment of a manual operating unit with a docking station, FIGS. 3A and 3B is a view of an embodiment of a docking station with associated manual operating unit, FIGS. 4A, 4B and 4C are various views of a manual operating unit with a docking station, and FIG. 5 is an exemplary embodiment of an electrically adjustable bed with a manual operating system.

FIGS. 1A, 1B and 1C show various views of a manual operating unit 100 according to the improved operating concept. Such a manual operating unit 100 is in particular intended for a furniture control, which is suitable for adjusting electrically adjustable seating or lounging furniture or also other furniture items.

The manual operating unit 100 comprises a housing 101 with a top side 110 and a bottom side 160. The illustration in FIG. 1A shows the manual operating unit 100 lying on a first, substantially flat region of the bottom side 160. FIG. 1B shows a view from above of the top side of the manual operating unit 100, whereas FIG. 1C shows a view from below of the bottom side 160 of the manual operating unit 100.

A first operating panel 120 and a third operating panel 130 are defined on the top side 110, the actuation of which in particular triggers a first or a second operating signal, which is transmitted to the furniture control (not illustrated here), preferably via a wireless communication module (not illustrated here either).

A second operating panel 170 and a fourth operating panel 180 are provided on the bottom side 160, in an inclined second region with regard to the contact plane or the first region, located opposite to the first and third operating panel 120, 130. The second and fourth operating panels 170, 180 are, for example, identified in the second, inclined region by corresponding arrows pointing upwards and/or downwards.

Such arrows are only intended to be exemplary and can also be replaced by other symbols or signs.

A function select element 190 is also provided in the second, inclined region, said function select element being particularly evident in FIG. 1C. Such function select element 190 has a function select button 191 as well as a display device, which is set up, for example, for displaying a selected operating option of the manual operating unit 100. Display options A, B and C are merely provided in the illustration in FIG. 1C as an example to this end, which may be visualized via background lighting. The function select element 190 with the function select button 191 is optional and can also be omitted in other embodiments.

A select block 140 with, for example, five select buttons 141 to 145 is provided on the top side 110 in addition to the first and second operating surfaces 120, 130. The select buttons 141 to 145 can have background lighting. The number of four or five select buttons 141 to 145 shown here is merely an exemplary selection and can, of course, be larger or smaller. The select buttons can, for example, also be used as rapid select buttons or rapid access buttons. Moreover, the provision of the select buttons can also be completely waived.

Corresponding sensor elements can be provided in the region of the first and third operating panels 120, 130, said sensor elements receiving an actuation of such operating panels. For example, corresponding push-buttons, which are arranged underneath the operating panels 120, 130, are provided in the housing 101 to this end. Said housing 101 is mounted in the region of the operating panels 120, 130 in such a way that the underlying push-button is actuated by pressing the corresponding operating panel. Alternatively, however, other actuating elements can also be provided as well.

The opposing second and fourth operating panels 170, 180 are, for example, designed with touch-sensitive sensors in the interior of the housing. However, other embodiments can also be used here.

Preferably both an actuation of the first operating panel 120 and an actuation of the second operating panel 170 trigger a first operating signal, whereas an actuation of the third operating panel as well as an actuation of the fourth operating panel triggers a second operating signal. For example, the first and second operating signals represent an upwards or downwards control. The function to be controlled thereby depends, for example, on a selection of stipulated operating options of the manual operating unit by the function select button 191. Thus, for example, in the event of a bed control, the function select button 191 allows a selection to be made between the adjustment of the head part, an adjustment of the foot part and a joint adjustment of the head and foot parts, in particular by cyclic interconnecting between the various operating options with each actuation of the function select button 191.

In order to support the push-button function in the top side 110 of the housing 101 on the operating panels 120, 130, a material recess can, for example, be provided in the housing, such a material recess being shown by a dash between the first and third operating panels 120, 130 in FIGS. 1A and 1B.

The function select button 191 can be actuated in various ways. For example, when the user looks directly on the bottom side 160, according to the illustration in FIG. 1C, said user can actuate the function select button 19 with a finger. However, when the manual operating unit 100 is laid on top, as shown in FIG. 1A, meaning that the user thus has no direct contact with the function select button 191, the button can be actuated by inclining the entire manual operating unit 100 towards the front, in that the housing 101 with the button 191 is pressed onto a surface. The inclination of the second region, in which the function select button 191 is arranged, prevents an unintentional actuation when the manual operating unit 100 is merely deposited.

The select buttons 141 to 144 can, for example, be used in such a way that a pre-specified sequence of control commands is transmitted to the furniture control when said select buttons are actuated, thus allowing a single button actuation to handle a complete program, comprising, for example, an adjustment function with subsequent massage function and setting of lighting. A different functional sequence can be assigned to each of the select buttons.

The fifth select button 145 serves, for example, to reset the bed into a flat position, in order be able to re-establish a basic setting in the event of an unintended adjustment, for instance. The button can, of course, also be used for other functions or functional sequences.

A display 165, in particular a graphic display or a liquid crystal display (LCD) is provided in the first, flat region in the illustration in FIG. 1C. Said display preferably has a touch-sensitive operating surface. The display can show status information of the furniture control as well as operating options.

In addition, when used simultaneously as a sensor, the various functions of the furniture control can also be controlled, by touching the appropriate menu options shown, for example.

A recess 162 is provided in a further inclined region, which juts out from the base surface. For example, said recess 162 allows electrical contacts to be accommodated, in order to supply the operating unit 100 with power and/or establish a wireless connection.

Such an electrical connection is preferably established with a corresponding docking station 200, which is exemplarily shown in combination with the manual operating unit 100 in FIG. 2. The form of said docking station 200 is adapted to the manual operating unit 100 and in particular accommodates the bottom side 160, and therefore only the top side 110 is visible and operable. For example, a charging process for rechargeable batteries of the operating unit 100 preferably ensues via the docking station 200. According to the improved operating concept, an operation via the first and third operating panels 120, 130 as well as the select buttons is also possible during the charging process. The docking station is connected with a power supply or with the furniture control via a cable 210, in order to receive corresponding supply currents for the operating unit 100.

In the embodiments shown, the bottom side 160 has the first, flat region as well as two inclined regions. However, completely waiving the design of such inclined regions, whether in full or in part, and designing the entire bottom side 160 as flat or substantially flat, for instance, also falls within the scope of the improved operating concept.

Two operating panels are also provided in the embodiments shown, one each on the top and bottom sides. In possible modifications, this number can also be larger or smaller, and therefore only the operating panel 120 is present on the top side and the operating panel 170 on the bottom side, for example. In another embodiment three or more operating panels per side are provided.

FIGS. 3A and 3B show oblique views of the docking station 200 or of the operating unit 100. It is evident that electrical contacts 220 are provided in the docking station, said electrical contacts being able to be accommodated accordingly in the recess 162 on the bottom side 160 of the operating unit 100. In addition to an energy supply, the electrical contacts 220 also allow data signals to be exchanged, via a serial data connection, for example.

The docking station 200 can also have lighting elements, which can in particular serve to provide an ambient light. Such an ambient light is, for example, provided in the region of the main contact surface 230 or on the edge thereof and can be executed by energy-saving light-emitting diodes. The ambient light can be activated in many ways. For example, the manual operating unit 100 is provided with a proximity sensor, a touch-sensitive sensor or a mechanical button or a combination thereof, the actuation of which triggers an activation of the ambient light. Said activation can, for example, be signalized via the previously described serial connection between manual operating unit 100 and docking station 200.

Instead or in addition to the ambient light in the docking station 200, lighting elements can also be provided in or on the manual operating unit 100, which can also be used as ambient light. For example, if present, background lighting of the described select buttons 141 to 145 or of the select block 140 can be used to this end. Similarly, the ambient light can, of course, also be realized in the form of LED lighting casting its light in a downward direction in the manual operating unit 100.

In some embodiments the display 165 or the LCD itself can be used as ambient light. It is thereby particularly advantageous when the display surface of the display 165 protrudes beyond the width of the docking station 200 and is thus visible. Using the display 165 has the advantage that the ambient light can be realized in various colours, according to mood, for example.

The ambient light function can, for example, allow the manual operating unit to be operated in the dark as well, thus allowing a pleasant and less obtrusive lighting to be achieved, without needing to switch on the full room lighting.

FIGS. 4A, 4B and 4C show further illustrations of the manual operating unit 100 with the docking station 200.

FIG. 5 shows an exemplary embodiment of a bed system with an electrically adjustable bed 300, as well as a manual operating unit 100 with docking station 200 according to a previously described embodiment. The docking station 200 is, for example, connected by the cable 210 with a furniture control (not visible here) arranged in the bed 300, said furniture control activating corresponding adjusting motors of the bed 300. In addition to or instead of an adjusting motor, other elements, such as a heating system, a massage motor for a massage function or such like, can also be activated by the furniture control. Control functions are preferably transmitted from the manual operating unit 100 to the furniture control via a wireless interface. The cable 210 essentially serves to supply the manual operating unit 100 with energy.

In addition to the use for a bed according to FIG. 5, the manual operating unit 100 with the docking station 200 can also be used with other electrically adjustable furniture items, in particular with seating furniture, such as adjustable recliner seats, electrically adjustable couch garnitures or such like.

The manual operating device 100 is also suitable for use in the care sector, where physically disabled users can still execute the most important functions on the manual operating unit themselves, while more complicated settings can, for example, be implemented by qualified personnel using the same manual.

The invention claimed is:

1. A manual operating unit for a furniture control, which is provided in particular for seating or lounging furniture, the manual operating unit comprising a housing with a top side and a bottom side, wherein
    a first operating panel and a third operating panel are defined on the top side;
    a second operating panel and a fourth operating panel are defined on the bottom side, which are arranged opposite to the first and the third operating panels;
    actuating the first operating panel triggers a first operating signal;
    actuating the second operating panel triggers the first operating signal;
    actuating the third operating panel triggers a second operating signal;
    actuating the fourth operating panel triggers the second operating signal; and
    the housing is movably mounted at least in the region of the first and third operating panels over push-buttons arranged in the housing in such a way that a first of said push-buttons is actuated by moving the housing in the region of the first operating panel and that a second of said push-buttons is actuated by moving the housing in the region of the third operating panel.

2. The manual operating unit according to claim 1, wherein the bottom side has a flat or substantially flat first region as well as at least one second region, which is inclined with relation to the first region, wherein the second and fourth operating panels are defined in the second, inclined region.

3. The manual operating unit according to claim 2, wherein a function select button is arranged in the second, inclined region, said function select button being in particular provided for selecting an operation option of the manual operating unit.

4. The manual operating unit according to claim 3, wherein the first region forms a main contact surface of the bottom side, wherein the function select button is arranged spaced apart from a plane formed by the main contact surface.

5. The manual operating unit according to claim 3, wherein a display device is arranged in the second, inclined region, said display device being provided to display a selected operating option of the manual operating unit.

6. The manual operating unit according to claim 2, wherein a display, in particular a graphic display or a liquid crystal display, is provided in the first region.

7. The manual operating unit according to claim 6, wherein the display has a touch-sensitive operating surface.

8. The manual operating unit according to claim 1, further comprising a wireless communication module, which is set up for exchanging data with a furniture control, in particular for transmitting control commands to the furniture control.

9. The manual operating unit according to claim 1, wherein one or more select buttons are additionally provided on the top side.

10. The manual operating unit according to claim 9, which is set up to transmit a saved sequence of control commands to a furniture control coupled with the manual operating unit when the select buttons are actuated.

11. A manual operating system with a manual operating unit according to claim 1 and with a docking station for accommodating the manual operating unit, wherein the manual operating unit accommodated in the docking station is supplied with power from the docking station by corresponding electrical contacting, in particular for charging an energy storage of the manual operating unit.

12. The manual operating system according to claim 11, wherein the docking station comprises electrical contacts, which can be accommodated in a recess on the bottom side of the manual operating unit.

13. The manual operating system according to claim 11, wherein the docking station and/or the manual operating unit has a lighting element, and wherein the manual operating unit has a proximity sensor and/or touch-sensitive sensor and/or a button, via which the switching on of the lighting element can be triggered.

14. The manual operating system according to claim 11, wherein the docking station has a USB port, via which a power supply is provided for the devices connected thereto.

15. The manual operating system according to claim 11, wherein a serial data connection is provided between the docking station and the manual operating unit.

16. A furniture control system with a manual operating system according to claim 11 and with a furniture control, which is coupled with the manual operating unit for receiving control commands, and which is set up to activate at least one motor and/or a heating system of an electrically adjustable furniture item.

17. An electrically adjustable bed with a furniture control system according to claim 16.

18. An electrically adjustable armchair with a furniture control system according to claim 16.

19. The manual operating unit according to claim 1, wherein the housing has an interior and an exterior side, wherein the top side and the bottom side are defined on the exterior side of the housing, and wherein the push buttons are arranged in the interior of the housing.

20. The manual operating unit according to claim 1, wherein the housing has flexible portions in the region of the first and the third operating panel.

* * * * *